(12) United States Patent
Choi et al.

(10) Patent No.: US 9,490,413 B2
(45) Date of Patent: Nov. 8, 2016

(54) COMPOUND SEMICONDUCTORS AND THEIR APPLICATION

(71) Applicant: LG CHEM, LTD., Seoul (KR)

(72) Inventors: Hyun-Woo Choi, Daejeon (KR);
Byung-Kyu Lim, Daejeon (KR);
Tae-Hoon Kim, Daejeon (KR);
Cheol-Hee Park, Daejeon (KR);
Eun-Ah You, Daejeon (KR); O-Jong Kwon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/437,119

(22) PCT Filed: Sep. 18, 2014

(86) PCT No.: PCT/KR2014/008705
§ 371 (c)(1),
(2) Date: Apr. 20, 2015

(87) PCT Pub. No.: WO2015/046810
PCT Pub. Date: Apr. 2, 2015

(65) Prior Publication Data
US 2016/0197256 A1    Jul. 7, 2016

(30) Foreign Application Priority Data

Sep. 27, 2013  (KR) .................. 10-2013-0115610
Sep. 16, 2014  (KR) .................. 10-2014-0122981

(51) Int. Cl.
| | | |
|---|---|---|
| *H01B 1/02* | (2006.01) | |
| *H01L 35/16* | (2006.01) | |
| *H01L 35/20* | (2006.01) | |
| *H01L 31/0272* | (2006.01) | |
| *H01L 35/18* | (2006.01) | |
| *H01L 35/34* | (2006.01) | |
| *C01B 19/00* | (2006.01) | |

(52) U.S. Cl.
CPC .......... *H01L 35/16* (2013.01); *C01B 19/007* (2013.01); *H01L 31/0272* (2013.01); *H01L 35/18* (2013.01); *H01L 35/34* (2013.01); *C01P 2006/32* (2013.01); *C01P 2006/40* (2013.01); *H01L 31/02725* (2013.01); *H01L 35/20* (2013.01)

(58) Field of Classification Search
None
See application file for complete search history.

(56) References Cited

U.S. PATENT DOCUMENTS

| | | | |
|---|---|---|---|
| 2010/0258154 A1 | 10/2010 | Heremans et al. | |
| 2010/0294326 A1* | 11/2010 | Guo .................. | B22F 3/14 136/238 |
| 2013/0105725 A1 | 5/2013 | Lee et al. | |
| 2013/0298954 A1* | 11/2013 | Ahn .................. | C01B 19/002 136/205 |
| 2013/0299754 A1* | 11/2013 | Hwang .............. | H01L 35/00 252/519.13 |
| 2014/0096809 A1* | 4/2014 | Kim .................. | H01L 35/16 136/205 |

FOREIGN PATENT DOCUMENTS

| | | | | |
|---|---|---|---|---|
| GB | 962111 A | * | 6/1964 | ....... C22C 32/0089 |
| KR | 10-2012-0031593 A | | 4/2012 | |
| KR | 10-2012-0061302 A | | 6/2012 | |
| KR | 10-2013-0045683 A | | 5/2013 | |
| KR | 10-2013-0071531 A | | 7/2013 | |
| WO | WO 2013/094952 A9 | | 6/2013 | |

OTHER PUBLICATIONS

Svechnikova et al. Thermoelectric Properties of Doped Single Crystal Solid Solutions Based on Bismuth Telluride. Proceedings of the International Conference on Thermoelectrics (1995) 14th, 10-12.*
Duan et al. Enhanced thermoelectric properties of n-type Bi2Te2.7Se0.3 by indium and sodium co-doping. Functional Materials Letters. vol. 8, No. 1 (2015).*
Svechnikova et al. Thermoelectric Properties of n-Bi2Te2.7Se0.3<I,In> Crystals. Inorganic Materials, 2011, vol. 47, No. 12 1314-1318.*
Quian Zhang et al., "High thermoelectric performance by resonant dopant indium in nanostructured SnTe", PNAS, Aug. 13, 2013, pp. 13261-13266, vol. 110, No. 33.
International Search Report for PCT/KR2014/008705 filed on Sep. 18, 2014.
T.E. Svechnikova et al., "Physical Properties of $Bi_2Te_{2.85}Se_{0.15}$ Single Crystals Doped with Cu, Cd, In, Ge, S, or Se", Inorganic Materials, 2000, pp. 556-560, vol. 36, No. 6, MAIK.
T.E. Svechnikova et al., "Properties of Sn-Doped $Bi_2Te_{3-x}Se_x$ Single Crystals", Inorganic Materials, 2006, pp. 101-107, vol. 42, No. 2, Pleiades Publishing, Inc.
L.V. Prokofieva et al., "Optimum Composition of a $Bi_2Te_{3-x}Se_x$ Alloy for the *n*-Type Leg of a Thermoelectric Generator", Semiconductors, 2009, pp. 973-976, vol. 43, No. 8, Pleiades Publishing, Ltd.

* cited by examiner

*Primary Examiner* — Tanisha Diggs

(57) ABSTRACT

Disclosed is a new compound semiconductor material which may be used for thermoelectric material or the like, and its applications. The compound semiconductor may be represented by Chemical Formula 1 below: Chemical Formula 1 <Chemical Formula 1> $Bi_2Te_xSe_{a-x}In_yM_z$ where, in Chemical Formula 1, M is at least one selected from the group consisting of Cu, Fe, Co, Ag and Ni, $2.5<x<3.0$, $3.0 \le a<3.5$, $0<y$ and $0 \le z$.

17 Claims, 2 Drawing Sheets

COMPOUND SEMICONDUCTORS AND THEIR APPLICATION

TECHNICAL FIELD

The present disclosure relates to a new compound semiconductor material which may be used for various purposes such as thermoelectric material, solar cells or the like, its manufacturing method, and its applications.

The present application claims priority to Korean Patent Application No. 10-2013-0115610 filed on Sep. 27, 2013 and Korean Patent Application No. 10-2014-0122981 filed on Sep. 16, 2014 in the Republic of Korea, the disclosures of which are incorporated herein by reference.

BACKGROUND ART

A compound semiconductor is a compound that is composed of at least two types of elements rather than one type of element such as silicon or germanium and operates as a semiconductor. Various types of compound semiconductors have been developed and are currently being used in various fields of industry. Typically, a compound semiconductor may be used in thermoelectric conversion devices using the Peltier Effect, light emitting devices using the photoelectric conversion effect, for example, light emitting diodes or laser diodes, fuel cells, and the like.

First, a solar cell is environment-friendly since it does not need an energy source other than solar rays, and therefore are actively studied as an alternative future energy source. A solar cell may be generally classified as a silicon solar cell using a single element of silicon, a compound semiconductor solar cell using a compound semiconductor, and a tandem solar cell where at least two solar cells having different band gap energies are stacked.

Among these, a compound semiconductor solar cell uses a compound semiconductor in a light absorption layer which absorbs solar rays and generates an electron-hole pair, and may particularly use compound semiconductors in the III-V groups such as GaAs, InP, GaAlAs and GaInAs, compound semiconductors in the II-VI groups such as CdS, CdTe and ZnS, and compound semiconductors in the I-III-VI groups represented by $CuInSe_2$.

The light absorption layer of the solar cell demands excellent long-term electric and optical stability, high photoelectric conversion efficiency, and easy control of the band gap energy or conductivity by composition change or doping. In addition, conditions such as production cost and yield should also be met for practical use. However, many conventional compound semiconductors fail to meet all of these conditions at once.

In addition, a thermoelectric conversion device is used for thermoelectric conversion power generation or thermoelectric conversion cooling applications, and generally includes an N-type thermoelectric semiconductor and a P-type thermoelectric semiconductor electrically connected in series and thermally connected in parallel. The thermoelectric conversion power generation is a method which generates power by converting thermal energy to electrical energy using a thermoelectromotive force generated by creating a temperature difference in a thermoelectric conversion device. Also, the thermoelectric conversion cooling is a method which produces cooling by converting electrical energy to thermal energy using an effect that a temperature difference creates between both ends of a thermoelectric conversion device when a direct current flows through the both ends of the thermoelectric conversion device.

The energy conversion efficiency of the thermoelectric conversion device generally depends on a performance index value or ZT of a thermoelectric conversion material. Here, the ZT may be determined based on the Seebeck coefficient, electrical conductivity, and thermal conductivity, and as a ZT value increases, a thermoelectric conversion material has better performance.

Even though many kinds of thermoelectric conversion materials have been proposed until now, it cannot be regarded that a thermoelectric conversion material ensuring a sufficient ZT value is proposed. In particular, recently, the necessity on thermoelectric conversion materials with high ZT values at low temperature, for example in a temperature range from room temperature to 250° C., is increasing, but a thermoelectric conversion material with sufficient thermoelectric conversion performance in the above temperature range has not yet proposed.

DISCLOSURE

Technical Problem

The present disclosure is designed to solve the above problem, and therefore, the present disclosure is directed to providing a compound semiconductor material having excellent thermoelectric conversion performance particularly at low temperature, which may be utilized for various purposes such as thermoelectric conversion material of a thermoelectric conversion device, a solar cell or the like, its manufacturing method, and a thermoelectric conversion device or a solar cell using the same.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect, after repeated studies of a compound semiconductor, inventors of the present disclosure have successfully synthesized a compound semiconductor represented by Chemical Formula 1, and found that this compound can be used for a thermoelectric conversion material of a thermoelectric conversion device or a light absorption layer of a solar cell.

$$Bi_2Te_xSe_{a-x}In_yM_z \quad \text{Chemical Formula 1}$$

In Chemical Formula 1, M is at least one selected from the group consisting of Cu, Fe, Co, Ag and Ni, $2.5<x<3.0$, $3.0 \leq a<3.5$, $0<y$ and $0 \leq z$.

Preferably, in Chemical Formula 1, y and z may satisfy the conditions of $0<y<0.009$ and $0 \leq z<0.09$.

Also preferably, in Chemical Formula 1, y+z may satisfy the condition of $0.002<y+z<0.09$.

Also preferably, in Chemical Formula 1, y may be 0.0068.
Also preferably, in Chemical Formula 1, z may be 0.0369.
Also preferably, in Chemical Formula 1, a may satisfy the condition of $a>3.0$.

Also preferably, the compound semiconductor is manufactured by a method including: forming a mixture containing Bi, Te and Se; thermally treating the mixture; adding In to the thermally treated mixture; and pressure-sintering the In-added mixture.

Also preferably, in the In adding step, M may be further added together with In.

Also preferably, the thermal treatment step may be performed by means of solid-state reaction.

Also preferably, the pressure sintering step may be performed by means of spark plasma sintering.

In another aspect of the present disclosure, there is also provided a preparation method of a compound semiconductor, which includes: forming a mixture containing Bi, Te and Se; thermally treating the mixture; adding In to the thermally treated mixture; and pressure-sintering the In-added mixture.

Preferably, in the In adding step, 0.1 wt % of In may be added based on the entire weight of the mixture.

Also preferably, in the In adding step, M may be further added together with In.

Also preferably, the thermal treatment step may be performed by means of solid-state reaction.

Also preferably, the pressure sintering step may be performed by means of spark plasma sintering.

In another aspect, the present disclosure also provides a thermoelectric conversion device, which includes the compound semiconductor as above.

In another aspect, the present disclosure also provides a solar cell, which includes the compound semiconductor as above.

In another aspect, the present disclosure also provides a bulk-type thermoelectric material, which includes the compound semiconductor as above.

Advantageous Effects

According to the present disclosure, a compound semiconductor material which may be used for a thermoelectric conversion device or a solar cell is provided.

In particular, the new compound semiconductor according to the present disclosure may replace a conventional compound semiconductor or may be used as another material in addition to the conventional compound semiconductor.

In addition, according to an embodiment of the present disclosure, the compound semiconductor may be used as a thermoelectric conversion material of a thermoelectric conversion device. In this case, a high ZT value is ensured, and thus a thermoelectric conversion device with excellent thermoelectric conversion performance may be manufactured. Further, in the present disclosure, a thermoelectric conversion material with a high ZT value in a temperature range from room temperature to 250° C. may be provided, and thus it is possible to manufacture a thermoelectric conversion device with good performance at low temperature.

In particular, the compound semiconductor according to the present disclosure may be used as an N-type thermoelectric conversion material.

In addition, in another aspect of the present disclosure, the compound semiconductor may be used for a solar cell. Particularly, the compound semiconductor of the present disclosure may be used as a light absorption layer of the solar cell.

Moreover, in another aspect of the present disclosure, the compound semiconductor may be used for an IR window which selectively passes IR, an IR sensor, a magnetic device, a memory or the like.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

BEST MODE

Figure 1:
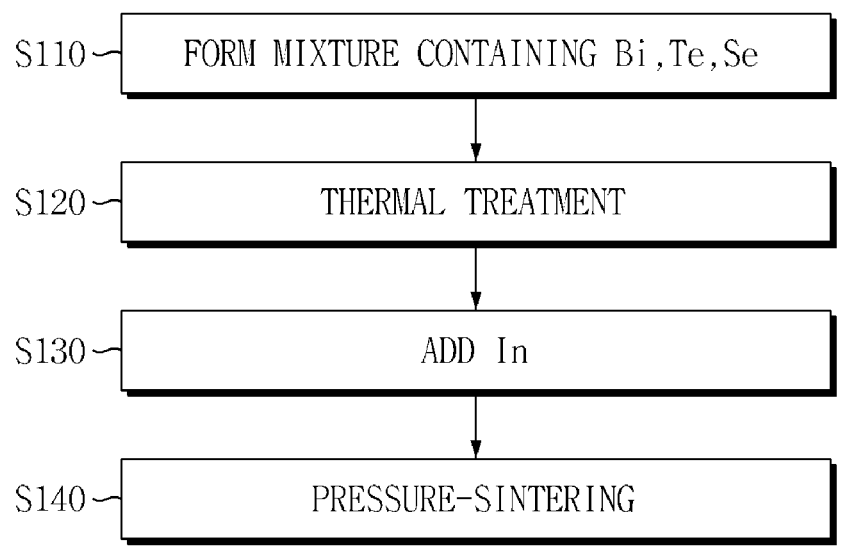
FIG. 1 is a flowchart for schematically illustrating a method for manufacturing a compound semiconductor according to the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

The present disclosure provides a new compound semiconductor represented by Chemical Formula 1 below.

$Bi_2Te_xSe_{a-x}In_yM_z$ <span style="float:right">Chemical Formula 1</span>

In Chemical Formula 1, M is at least one selected from the group consisting of Cu, Fe, Co, Ag and Ni, $2.5<x<3.0$, $3.0 \leq a<3.5$, $0<y$ and $0 \leq z$.

As described above, the compound semiconductor according to the present disclosure further includes In in addition to Bi, Te and Se. Therefore, electric conductivity is improved and/or thermal conductivity is lowered, which may provide a thermoelectric conversion material with an improved ZT value.

In addition, the compound semiconductor according to the present disclosure selectively includes M, namely Cu, Fe, Co, Ag, Ni or the like in addition to Bi, Te and Se, which may further improve thermoelectric conversion performance.

In particular, in the compound semiconductor according to the present disclosure, In and M (Cu, Fe, Co, Ag, Ni) may be included in a thermoelectric material composed of Bi, Te and Se to lower thermal conductivity. For example, In or M may be located between lattices of a thermoelectric material composed of Bi, Te and Se and may form an interface with Bi, Te and Se. In addition, phonon scattering may occur at the interface, which may reduce lattice thermal conductivity and thus reduce thermal conductivity of the compound semiconductor according to the present disclosure. In addition, in the compound semiconductor according to the present disclosure, In and M may contribute to the increase of electric conductivity.

Preferably, in Chemical Formula 1, y may satisfy the condition of $0<y<0.009$.

Also preferably, in Chemical Formula 1, z may satisfy the condition of $0 \leq z<0.09$.

Preferably, in Chemical Formula 1, y+z may satisfy the condition of 0.002<y+z<0.09. More preferably, in Chemical Formula 1, y+z may satisfy the condition of 0.005<y+z<0.05

In particular, the compound semiconductor according to the present disclosure may have an excellent thermoelectric conversion characteristic when 0.1 wt % of In is added based on the entire weight of the mixture. At this time, in Chemical Formula 1, y may satisfy the condition of y=0.0068. For example, the compound semiconductor according to the present disclosure may have an excellent thermoelectric conversion characteristic when being expressed by a chemical formula $Bi_2Te_xSe_{a-x}In_{0.0068}$.

Also preferably, the compound semiconductor according to the present disclosure may have an excellent thermoelectric conversion characteristic when 0.3 wt % of M, for example Cu, is added based on the entire weight of the mixture. At this time, in Chemical Formula 1, z may be 0.0369. For example, the compound semiconductor according to the present disclosure may have an excellent thermoelectric conversion characteristic when being expressed by a chemical formula $Bi_2Te_xSe_{a-x}In_{0.0068}Cu_{0.0369}$.

Also preferably, in Chemical Formula 1, a may satisfy the condition of a>3.0. A material expressed by $Bi_2Te_xSe_{3-x}$ has been disclosed as an existing N-type thermoelectric conversion material, the compound semiconductor according to the present disclosure may have further improved thermoelectric conversion performance by further including In or M and also changing a total content ratio of Te and Se in comparison to Bi.

Also preferably, in Chemical Formula 1, x may be 2.68, and a may be 3.14. In other words, the compound semiconductor according to the present disclosure may be expressed by a chemical formula $Bi_2Te_{2.68}Se_{0.46}In_yM_z$. The inventors have found through repeated studies that the compound semiconductor may have more excellent thermoelectric conversion performance when the compound semiconductor according to the present disclosure is expressed by the above chemical formula.

Meanwhile, the compound semiconductor represented by Chemical Formula 1 may include a secondary phase partially, and the amount of the secondary phase may vary depending on a thermal treatment condition.

FIG. 1 is a flowchart for schematically illustrating a method for manufacturing a compound semiconductor according to the present disclosure.

Referring to FIG. 1, a method for manufacturing a compound semiconductor according to the present disclosure may include: forming a mixture containing Bi, Te and Se (S110), thermally treating the mixture (S120), adding In to the thermally treated mixture (S130) and pressure-sintering the In-added mixture (S140).

Preferably, in Step S130, at least one (M) of Cu, Fe, Co, Ag and Ni may be further added in addition to In.

Meanwhile, in the mixing step S110, shot materials of Bi, Te and Se may be grinded and hand-milled, and then pelletized, but the present disclosure is not limited to these specific mixing methods.

In the thermal treatment step S120, elements contained in the mixture may be reacted to form a BiTeSe-based powder, for example $Bi_2Te_{2.68}Se_{0.46}$ powder. At this time, the thermal treatment step may be performed in a temperature range of 350° C. to 450° C. for 10 hours to 15 hours. For example, in the thermal treatment step, the pelletized material may be put into a tube furnace and then maintained at 400° C. for 12 hours so that materials may react with each other.

Preferably, Step S120 may be performed by means of solid state reaction (SSR). Even though the thermoelectric material has the same composition, its thermoelectric performance may vary depending on a reaction method among materials. In the compound semiconductor according to the present disclosure, when materials are reacted by means of SSR, the manufactured compound semiconductor may have more improved thermoelectric performance in comparison to the cases using other methods, such as melting.

Also preferably, in the In adding step S130, 0.1 wt % to 0.5 wt % of In, or In and M, based on the entire weight of the mixture to which In and M may be added. In particular, in Step S130, 0.1 wt % of In may be added based on the entire weight of the mixture of the compound semiconductor. In this composition range, the thermoelectric conversion performance may be more improved by the addition of In.

In addition, in Step S130, if M is added together with In, 0.3 wt % of M may be added based on the entire weight of the mixture. For example, in Step S130, 0.1 wt % of In and 0.3 wt % of Cu may be added based on the entire weight of the mixture. In this composition range, the thermoelectric conversion performance may be more improved by the addition of M.

Meanwhile, In and M added in Step S130 may be in a powder form. For example, Step S130 may be performed by adding In powder, also selectively Cu powder, Fe powder, Co powder, Ag powder or Ni powder, to $Bi_2Te_{2.68}Se_{0.46}$ powder. In this embodiment, the process may be simplified without performing raw material melting or other complicated processes.

Also preferably, the pressure sintering step S140 may be performed by means of spark plasma sintering (SPS). Even though the thermoelectric material has the same composition, thermoelectric performance may vary depending on a sintering method. In the compound semiconductor according to the present disclosure, the thermoelectric performance may be more improved when the SPS sintering method is applied.

The pressure sintering step S140 may be performed under a pressure of 40 MPa to 60 MPa. In addition, the pressure sintering step S140 may be performed at temperature of 380° C. to 450° C. Moreover, the pressure sintering step S140 may be performed for 4 minutes to 10 minutes under the above pressure and temperature conditions.

The compound semiconductor may have different thermoelectric performance depending on its manufacturing method, and the compound semiconductor according to the present disclosure may be manufactured using the above compound semiconductor manufacturing method. In this case, the compound semiconductor may ensure a high ZT value, and particularly it is advantageous to ensure a high ZT value in a temperature range of 20° C. to 250° C.

A thermoelectric conversion device according to the present disclosure may include the compound semiconductor described above. In other words, the compound semiconductor according to the present disclosure may be used as a thermoelectric conversion material for the thermoelectric conversion device. Particularly, the thermoelectric conversion device according to the present disclosure may include the above compound semiconductor as an N-type thermoelectric material.

The compound semiconductor according to the present disclosure has a large ZT value, which is a performance index of the thermoelectric conversion material. In addition, due to low thermal conductivity, a high Seebeck coefficient and high electric conductivity, the compound semiconductor has excellent thermoelectric conversion performance.

Therefore, the compound semiconductor according to the present disclosure may replace a conventional thermoelectric conversion material or may be used for a thermoelectric conversion device in addition to the conventional compound semiconductor.

In addition, the compound semiconductor according to the present disclosure may be applied to a bulk-type thermoelectric conversion material. In other words, the bulk-type thermoelectric material according to the present disclosure includes the compound semiconductor described above.

In addition, a solar cell according to the present disclosure may include the compound semiconductor above. In other words, the compound semiconductor according to the present disclosure may be used for a solar cell, particularly as a light absorption layer of the solar cell.

The solar cell may be produced in a structure where a front surface transparent electrode, a buffer layer, a light absorption layer, a rear surface electrode and a substrate are laminated in order from the side where a solar ray is incident. The substrate located at the lowest portion may be made of glass, and the rear surface electrode on the entire surface thereof may be formed by depositing metal such as Mo.

Subsequently, the compound semiconductor according to the present disclosure may be laminated on the rear surface electrode by means of an electron beam deposition method, a sol-gel method, or a PLD (Pulsed Laser Deposition) to form the light absorption layer. On the light absorption layer, a buffer layer for buffering the difference in lattice constants and band gaps between a ZnO layer serving as the front surface transparent electrode and the light absorption layer may be present. The buffer layer may be formed by depositing a material such as CdS by means of CBD (Chemical Bath Deposition) or the like. Next, the front surface transparent electrode may be formed on the buffer layer by means of sputtering or the like as a ZnO film or a ZnO and ITO laminate.

The solar cell according to the present disclosure may be modified in various ways. For example, it is possible to manufacture a tandem solar cell where a solar cell using the compound semiconductor according to the present disclosure as the light absorption layer is laminated. In addition, the solar cell laminated as described above may employ a solar cell using silicon or another known compound semiconductor.

In addition, it is possible to change a band gap of the compound semiconductor according to the present disclosure and laminate a plurality of solar cells which use compound semiconductors having different band gaps as the light absorption layer. The band gap of the compound semiconductor according to the present disclosure may be adjusted by changing a composition ratio of a component of the compound, for example Te.

In addition, the compound semiconductor according to the present disclosure may also be applied to IR windows which selectively pass IR or IR sensors.

Hereinafter, the present disclosure will be described in detail through examples and comparative examples. The examples of the present disclosure, however, may take several other forms, and the scope of the present disclosure should not be construed as being limited to the following examples. The examples of the present disclosure are provided to more fully explain the present disclosure to those having ordinary knowledge in the art to which the present disclosure pertains.

Comparative Example

Bi, Te and Se shots were prepared as reagents, and were grinded and mixed by means of hand-milling to make a mixture having a composition of $Bi_2Te_{2.7}Se_{0.3}$. In addition, the mixture was put into a quartz tube and vacuum-sealed to make an ampoule, and then the ampoule was located in a tube furnace and thermally treated at 400° C. for 12 hours.

The powder composed as above was pressed by 50 MPa and sintered at 400° C. for 5 minutes by means of spark plasma sintering (SPS).

For a part of the sintered sample, electric conductivity was measured in a 2-point probe method by using ZEM-3 (Ulvac-Rico, Inc.).

In addition, for another part of the sintered sample, thermal conductivity was measured in a Laser flash method by using LFA457 (Netzsch). In more detail, laser was irradiated to one side of the pellet-type sample, then temperature of the other side was measured to calculate thermal diffusivity, and the thermal diffusivity was multiplied by density and specific heat of the sample to measure thermal conductivity of the sample.

Figure 2:
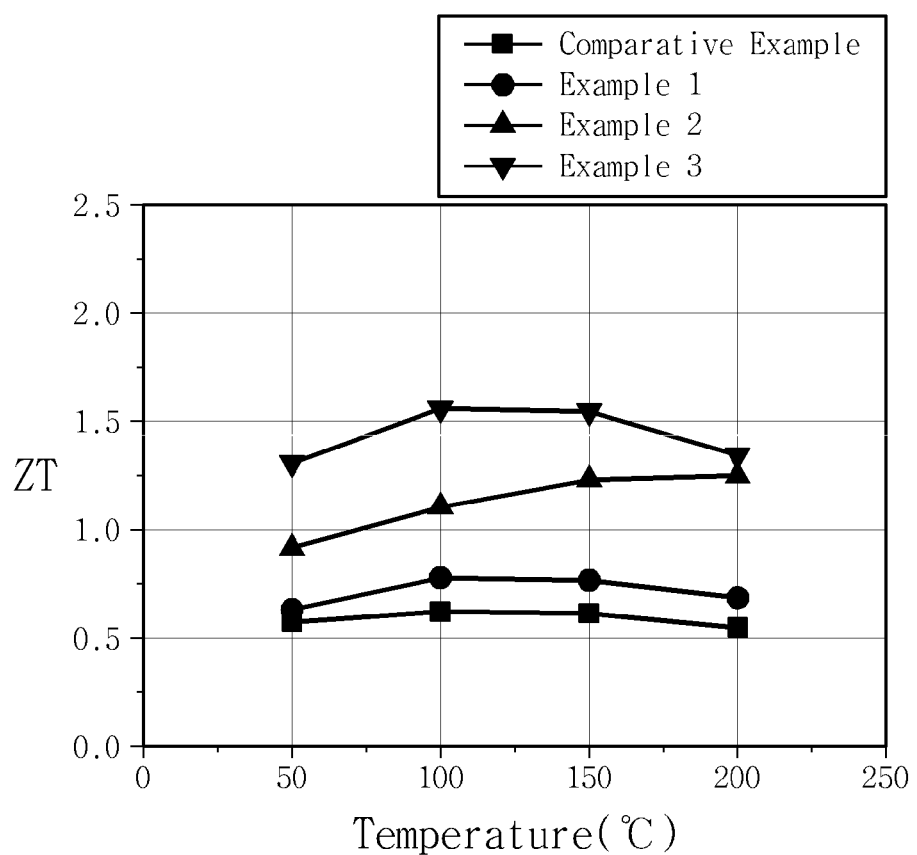
FIG. 2 is a graph showing ZT values according to a temperature change of compound semiconductors according to the example according to the present disclosure and the comparative example.

Also, a ZT value was calculated by using the measured values. The calculation result is depicted in FIG. 2 as the Comparative Example.

Example 1

Bi, Te and Se shots were prepared as reagents, and were grinded and mixed by means of hand-milling to make a mixture having a composition of $Bi_2Te_{2.7}Se_{0.3}$. In addition, the mixture was put into a quartz tube and vacuum-sealed to make an ampoule, and then the ampoule was located in a tube furnace and thermally treated at 400° C. for 12 hours.

0.1 wt % of In was added to the powder composed as above, and then mixed by means of hand-milling to make a mixture having a composition of $Bi_2Te_{2.7}Se_{0.3}In_{0.0068}$.

In addition, the material to which In was added was pressed by 50 MPa and sintered at 400° C. for 5 minutes by means of spark plasma sintering (SPS).

For the sintered sample, electric conductivity and thermal conductivity were measured in the same way as in the Comparative Example, and a ZT value was calculated by using the measured values. The calculation result is depicted in FIG. 2 as Example 1.

Example 2

Bi, Te and Se shots were prepared as reagents, and were grinded and mixed by means of hand-milling to make a mixture having a composition of $Bi_2Te_{2.68}Se_{0.46}$. In addition, the mixture was put into a quartz tube and vacuum-sealed to make an ampoule, and then the ampoule was located in a tube furnace and thermally treated at 400° C. for 12 hours.

0.1 wt % of In was added to the powder composed as above, and then mixed by means of hand-milling to make a mixture having a composition of $Bi_2Te_{2.68}Se_{0.46}In_{0.0068}$.

In addition, the material to which In was added was pressed by 50 MPa and sintered at 400° C. for 5 minutes by means of spark plasma sintering (SPS).

For the sintered sample, electric conductivity and thermal conductivity were measured in the same way as in the Comparative Example, and a ZT value was calculated by using the measured values. The calculation result is depicted in FIG. 2 as Example 2.

Example 3

Bi, Te and Se shots were prepared as reagents, and were grinded and mixed by means of hand-milling to make a mixture having a composition of $Bi_2Te_{2.68}Se_{0.46}$. In addition, the mixture was put into a quartz tube and vacuum-sealed to make an ampoule, and then the ampoule was located in a tube furnace and thermally treated at 400° C. for 12 hours.

0.1 wt % of In and 0.3 wt % of Cu were added to the powder composed as above, and then mixed by means of hand-milling to make a mixture having a composition of $Bi_2Te_{2.68}Se_{0.46}In_{0.0068}Cu_{0.0369}$.

In addition, the material to which In and Cu were added was pressed by 50 MPa and sintered at 400° C. for 5 minutes by means of spark plasma sintering (SPS).

For the sintered sample, electric conductivity and thermal conductivity were measured in the same way as in the Comparative Example, and a ZT value was calculated by using the measured values. The calculation result is depicted in FIG. 2 as Example 3.

If the ZT value of each material prepared as above is looked at with reference to the results shown in FIG. 2, it could be understood that the ZT values of the compound semiconductors according to Examples 1 to 3 of the present disclosure are greatly higher than that of the compound semiconductor according to the Comparative Example. In particular, in case of Example 2 and 3, in the temperature range of 50° C. to 200° C., the ZT values are greatly different from that of the Comparative Example. Further, in Example 3, in the temperature range of 50° C. to 200° C., the ZT value is generally 1.25 or above, which is greatly different from that of the Comparative Example which is lower than, 0.7.

If the above results are considered together, it may be understood that the compound semiconductor according to the present disclosure has a much greater ZT value in comparison to the compound semiconductor of the Comparative Example. This may be caused by the fact that the compound semiconductor according to the present disclosure has higher electric conductivity and/or lower thermal conductivity in comparison to the compound semiconductor of the Comparative Example. Therefore, the compound semiconductor according to the embodiment of the present disclosure may be regarded as having excellent thermoelectric conversion and so can be very useful as a thermoelectric conversion material.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A compound semiconductor, represented by Chemical Formula 1 below:

$$Bi_2Te_xSe_{a-x}In_yM_z \quad \text{<Chemical Formula 1>}$$

wherein, in Chemical Formula 1, M is at least one selected from the group consisting of Cu, Fe, Co, Ag, and Ni, and wherein $2.5<x<3.0$, $3.0\leq a<3.5$, $0<y$, and $0<z$.

2. The compound semiconductor according to claim 1, wherein, in Chemical Formula 1, y and z satisfy the conditions of $0<y<0.009$ and $0<z<0.09$.

3. The compound semiconductor according to claim 1, wherein, in Chemical Formula 1, y+z satisfies the condition of $0.002<y+z<0.09$.

4. The compound semiconductor according to claim 1, wherein, in Chemical Formula 1, y is 0.0068.

5. The compound semiconductor according to claim 1, wherein, in Chemical Formula 1, z is 0.0369.

6. The compound semiconductor according to claim 1, wherein, in Chemical Formula 1, a satisfies the condition of $a>3.0$.

7. The compound semiconductor according to claim 1, wherein the compound semiconductor is manufactured by a method including:
    forming a mixture containing Bi, Te and Se;
    thermally treating the mixture;
    adding In and M to the thermally treated mixture; and
    pressure-sintering the In and M-added mixture.

8. The compound semiconductor according to claim 7, wherein the mixture is thermally treated by means of a solid-state reaction.

9. The compound semiconductor according to claim 7, wherein the In and M-added mixture is pressure sintered by means of spark plasma sintering.

10. A preparation method of a compound semiconductor defined in the claim 1, comprising:
    forming a mixture containing Bi, Te, and Se;
    thermally treating the mixture;
    adding In and M to the thermally treated mixture; and
    pressure-sintering the In and M-added mixture.

11. The preparation method of a compound semiconductor according to claim 10,
    wherein adding the In and M includes adding 0.1 wt % of In based on the entire weight of the mixture.

12. The preparation method of a compound semiconductor according to claim 10,
    wherein the thermal treatment step is performed by means of a solid-state reaction.

13. The preparation method of a compound semiconductor according to claim 10,
    wherein the In and M-added mixture is pressure sintered by means of spark plasma sintering.

14. A thermoelectric conversion device, which includes the compound semiconductor defined in claim 1.

15. The thermoelectric conversion device according to claim 14, which includes the compound semiconductor defined in claim 1 as an N-type thermoelectric conversion material.

16. A solar cell, which includes the compound semiconductor defined in claim 1.

17. A bulk-type thermoelectric material, which includes the compound semiconductor defined in claim 1.

* * * * *